(12) United States Patent
Farghaly et al.

(10) Patent No.: US 9,594,128 B2
(45) Date of Patent: Mar. 14, 2017

(54) TWO AXES MEMS RESONANT MAGNETOMETER

(71) Applicants: IMEC, Leuven (BE); King Abdulaziz City for Science and Technology, Riyadh (SA)

(72) Inventors: Mahmoud A. Farghaly, Assiut (EG); Veronique Rochus, Liege (BE); Xavier Rottenberg, Kessel-lo (BE); Hendrikus Tilmans, Maasmechelen (BE)

(73) Assignees: King Abulaziz City for Science and Technology, Riyadh (SA); IMEC, Leuven (BE)

( * ) Notice: Subject to any disclaimer, the term of this patent is extended or adjusted under 35 U.S.C. 154(b) by 0 days.

(21) Appl. No.: 14/228,090

(22) Filed: Mar. 27, 2014

(65) Prior Publication Data

US 2014/0292323 A1 Oct. 2, 2014

(30) Foreign Application Priority Data

Mar. 27, 2013 (EP) ..................................... 13161353

(51) Int. Cl.
*G01R 33/02* (2006.01)
*G01R 33/028* (2006.01)
(Continued)

(52) U.S. Cl.
CPC ....... *G01R 33/0286* (2013.01); *G01R 15/245* (2013.01); *G01R 33/0005* (2013.01);
(Continued)

(58) Field of Classification Search
CPC .............. G01R 33/0286; G01R 15/245; G01R 33/028; G01R 33/038; G01R 33/0005;
(Continued)

(56) References Cited

U.S. PATENT DOCUMENTS 5,563,343 A * 10/1996 Shaw et al. ................ 73/514.18
8,860,403 B2   10/2014 Walther
(Continued)

FOREIGN PATENT DOCUMENTS

CN   WO2014075407    *  2/2013   ........... G01R 33/028
DE   10 2010 000 739 A1   7/2011
WO   2014075402 A1   5/2014

OTHER PUBLICATIONS

CN 102914750 Machine Translation, Mecromechanical Field Sensor and Application Thereof, Feb. 6, 2013.*
Vashwar, Mo Li et al., "Three-Axis Lorentz-Force Magnetic Sensor for Electronic Compass Applications", Journal of Microelectromechanical Systems, vol. 21, No. 4, Aug. 2012, pp. 1002-1010.
European Search Report and Opinion for EP Application No. 14 161 687, dated Aug. 22, 2014.

*Primary Examiner* — Huy Q Phan
*Assistant Examiner* — Raul Rios Russo
(74) *Attorney, Agent, or Firm* — McDonnell Boehnen Hulbert & Berghoff LLP

(57) ABSTRACT

A two-axes MEMS magnetometer includes, in one plane, a freestanding rectangular frame having inner walls and four torsion springs, wherein opposing inner walls of the frame are contacted by one end of only two torsion springs, each torsion spring being anchored by its other end, towards the center of the frame, to a substrate. In operation, the magnetometer measures the magnetic field in two orthogonal sensing modes using differential capacitance measurements.

6 Claims, 10 Drawing Sheets

(51) Int. Cl.
*G01R 15/24* (2006.01)
*G01R 33/00* (2006.01)
*G06F 17/50* (2006.01)
*G01V 3/08* (2006.01)
*G01V 3/40* (2006.01)

(52) U.S. Cl.
CPC ....... *G01R 33/028* (2013.01); *G01R 33/0283* (2013.01); *G06F 17/5086* (2013.01); *G01V 3/087* (2013.01); *G01V 3/40* (2013.01)

(58) Field of Classification Search
CPC . G01R 33/0283; G06F 17/5086; G01C 17/04; G01C 17/28; G01V 3/087; G01V 3/40
USPC ... 324/51, 55, 200, 205, 225, 227, 228, 244, 324/256, 259; 716/110
See application file for complete search history.

(56) References Cited

U.S. PATENT DOCUMENTS

| | | | |
|---|---|---|---|
| 2007/0030001 A1* | 2/2007 | Brunson et al. | 324/253 |
| 2007/0085533 A1* | 4/2007 | Bolle | G01R 33/038 324/244 |
| 2009/0289747 A1* | 11/2009 | Duraffourg et al. | 333/219.2 |
| 2010/0242603 A1* | 9/2010 | Miller | B81B 7/02 73/514.32 |
| 2011/0140693 A1* | 6/2011 | Baldo | G01R 33/0005 324/244 |
| 2013/0241546 A1* | 9/2013 | Fu | G01R 33/0286 324/259 |
| 2014/0049256 A1* | 2/2014 | Smith | G01R 33/0286 324/259 |

* cited by examiner

TWO AXES MEMS RESONANT MAGNETOMETER

CROSS-REFERENCE TO RELATED APPLICATION

This application claims priority to European Patent Application No. 13161353.1 filed on Mar. 27, 2013, the contents of which are hereby incorporated by reference.

FIELD

The present disclosure is related to microelectromechanical (MEMS) resonant magnetometers, in particular to teeter-totter magnetometers actuated by the Lorentz force.

STATE OF THE ART

Magnetometers for sensing magnetic fields are used in various applications in industry, for example, in the biomedical field or in consumer electronics, such as an electronic compass in mobile phones. For many of these applications, magnetometers should be sufficiently compact to reduce a footprint of the component.

Microelectromechanical technology (MEMS) facilitates the manufacture of compact magnetometers. Generally, MEMS magnetometers can be operated using the Hall effect, the magnetoresistance effect, or the Lorentz Force.

The Hall-based magnetometers exhibit a large hysteresis, can have a smaller sensitivity, and can be difficult to integrate with other MEMS devices and/or semiconductor devices. Magnetometers using the magnetoresistance effect to sense the magnetic field can require dedicated magnetic materials, can suffer from larger power consumption, and can also be difficult to integrate. Lorentz Force based magnetometers generally offer a sufficiently high sensitivity, can have low power consumption, and can be easier to integrate.

Lorentz Force based MEMS magnetometers have a conductor that deflects in response to an interaction between an electrical current flowing through the conductor and an external magnetic field in which the conductor is placed. The direction and the magnitude of the deflection depend on the direction and the magnitude of this electrical current and the external magnetic field present.

Several research efforts have been directed to developing a multi-axes MEMS magnetometer for use in motion tracking units or Inertial Measurements Units (IMUS) or can be used as part of a backup navigation system if GPS is either unavailable or unreliable. Typically, such multi-axis MEMS magnetometers are composed of several single axis MEMS magnetometers, whereby each magnetometer is positioned to sense the magnetic field along a particular axis.

Li et al. discloses in "Three-Axis Lorentz-Force Magnetic Sensor for Electronic Compass Applications" IEEE Journal of Microelectromechanical Systems, Vol. 21, No. 4, August 2012, a magnetometer that allows, in a single MEMS structure, two-axis magnetic field measurement using the Lorentz Force. The disclosed MEMS device, however, has a considerable footprint. In addition, manufacturing of the magnetometer can be complex as the device is composed of several layers. Further, the sensitivity of the magnetometer can be limited as sensing of the magnetic field in one orthogonal direction is performed using a differential capacitive measurement, while in the other orthogonal direction a single pick-off electrode can be used.

Hence, there is a desire for a compact MEMS-based resonant magnetometer using the Lorentz Force that facilitates the measurement of magnetic fields along more than one axis. Such a magnetometer should be capable of being manufactured simply, and should be configured to yield a higher sensitivity when measuring magnetic fields.

SUMMARY

A two-axes MEMS resonant magnetometer is disclosed including, in one plane, a freestanding rectangular frame having inner walls and four torsion springs. Opposing inner walls of the frame can be contacted by one end of only two of the torsion springs, each spring being anchored by its other end to a substrate. The torsion springs can include an L-shaped spring, a folded beam spring, or serpentine spring, for example.

The substrate of this magnetometer may include two electrically isolated power supply lines, whereby diagonally facing anchored ends of the torsion springs are electrically connected to the same power supply line.

On this substrate, four sensing electrodes or capacitors can be present, whereby each sensing electrode can be capacitively coupled to a different side of the rectangular frame.

The rectangular frame and the torsion springs of this magnetometer are preferably formed of the same material. This material can be selected to have low electrical resistivity to obtain low power consumption, low Young's modulus to be less stiff and increase sensitivity and low stress gradient and residual stress to avoid buckling and sensor failure. The material can be a metal, e.g., Aluminium, copper, nickel, or silicon compounds, such as silicon germanium.

The disclosure also discloses a MEMS magnetometer that includes, in one plane, a rectangular frame having inner walls and four torsion springs. The end of one leg of each torsion spring can be attached to an inner wall, whereby opposing inner walls are contacted by only two of the torsion springs, while the end of the other leg of each torsion spring is anchored, in case of L-shaped springs, towards the centre of the frame to a substrate having two power supply lines. In one aspect, diagonally facing anchored ends of the torsion springs are electrically connected to the same power supply line.

The present disclosure also relates to a method for designing a MEMS magnetometer according to the foregoing paragraphs. The method includes dimensioning the frame and the torsion springs to maximize a sensitivity of a differential capacitive measurement between opposite capacitors, while minimizing cross-sensitivities of the differential capacitive measurement between adjacent capacitors.

The present disclosure also relates to a method for operating a MEMS magnetometer according to the foregoing paragraphs. The method includes placing the MEMS magnetometer in a magnetic field and applying an AC voltage between the two power supply lines. The AC voltage can have a frequency equal to a frequency of at least one of the two orthogonal modes of the MEMS magnetometer, thereby creating a current flowing between opposite biased anchored ends. The method can also include measuring the differential capacitance between the opposite capacitors corresponding to the orthogonal mode, and determining from this differential capacitance an in-plane component of the magnetic field.

DETAILED DESCRIPTION

Figure 1:
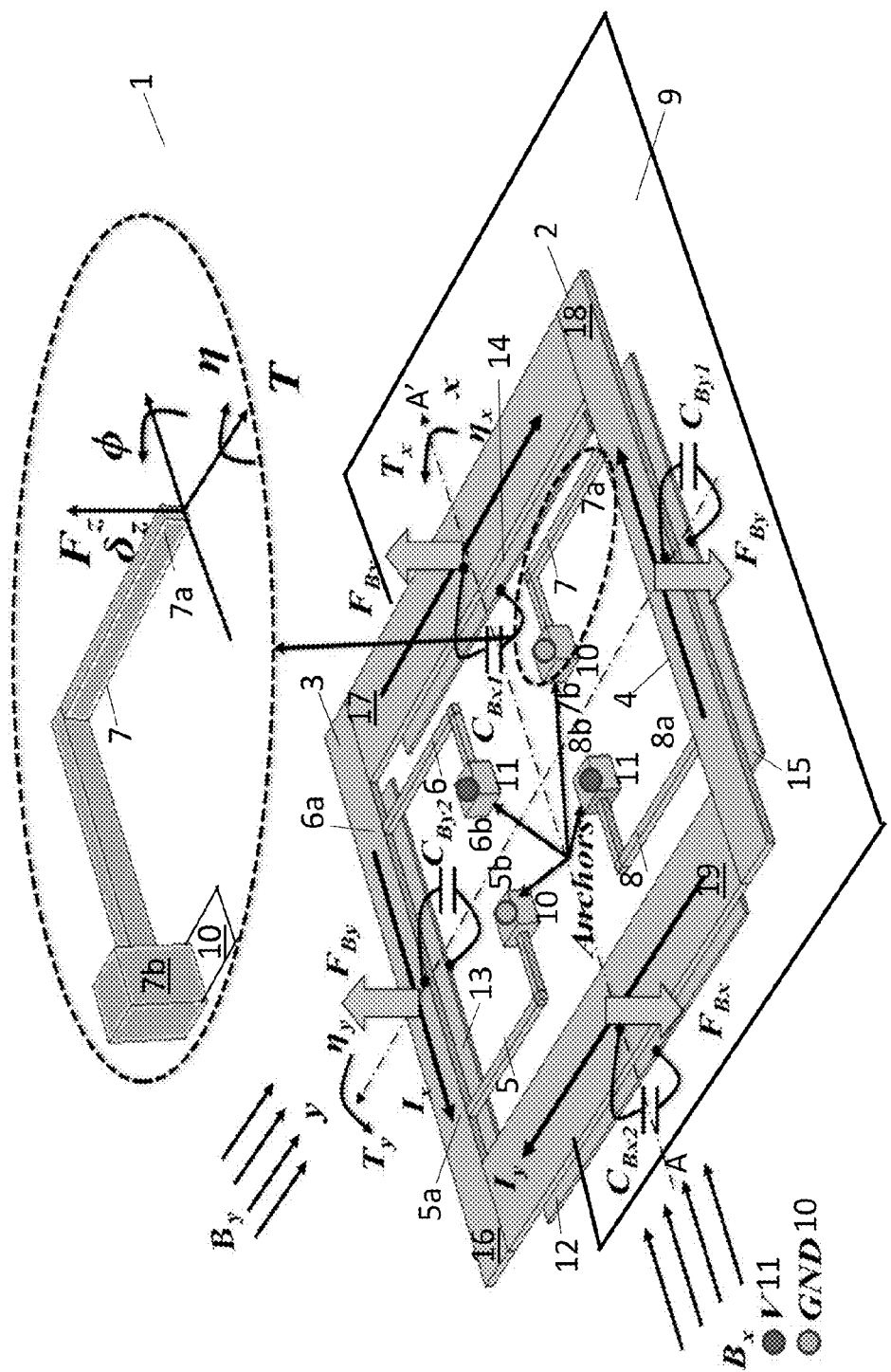
FIG. 1 shows a schematic view of a magnetometer according to this disclosure.

The present disclosure will be described with respect to particular embodiments and with reference to certain drawings but the disclosure is not limited thereto. The drawings described are only schematic and are non-limiting. In the drawings, the size of some of the elements may be exaggerated and not drawn to scale for illustrative purposes. The dimensions and the relative dimensions in the drawings do not necessarily correspond to actual reductions to practice of the disclosure.

Moreover, the terms top, bottom, over, under, and the like in the description and the claims are used for descriptive purposes and are not necessarily for describing relative positions, unless context dictates otherwise. The terms so used are interchangeable under appropriate circumstances and the embodiments of the disclosure described herein can operate in other orientations than explicitly described or illustrated herein.

The term "comprising", used in the claims, should not be interpreted as being restricted to the means listed thereafter; it does not exclude other elements or steps. The term should be interpreted as specifying the presence of the stated features, integers, steps, or components as referred to, but does not preclude the presence or addition of one or more other features, integers, steps, or components, or groups thereof. Thus, the scope of the expression "a device comprising A and B" should not be limited to devices consisting of only components A and B. Rather the term means that with respect to the particular claim or description, the relevant components of the device are A and B.

The disclosed magnetometer 1 is a two-axes resonant magnetometer using a single MEMS structure. In addition, the magnetometer uses differential capacitive sensing for detecting the two in-plane components of the magnetic field. The disclosed design is configured in a very efficient way resulting in a smaller footprint. This compact design is achieved by bringing supporting beams, e.g., springs 5, 6, 7, 8, inside a freestanding frame 2. Hence, the springs 5, 6, 7, 8 and the frame 2 are within the same plane, except for anchored ends 5b, 6b, 7b, 8b of the springs anchored to a substrate 9. Hence the springs and the frame can be formed of the same conductive material, preferably metal. Finally, the levels of cross coupling between adjacent capacitors, e.g., sensing electrodes 12, 13, 14, 15, for different magnetic field components are minimized by employing differential capacitive measurement or sensing, and operating the device in orthogonal mode shapes.

Figure 3:
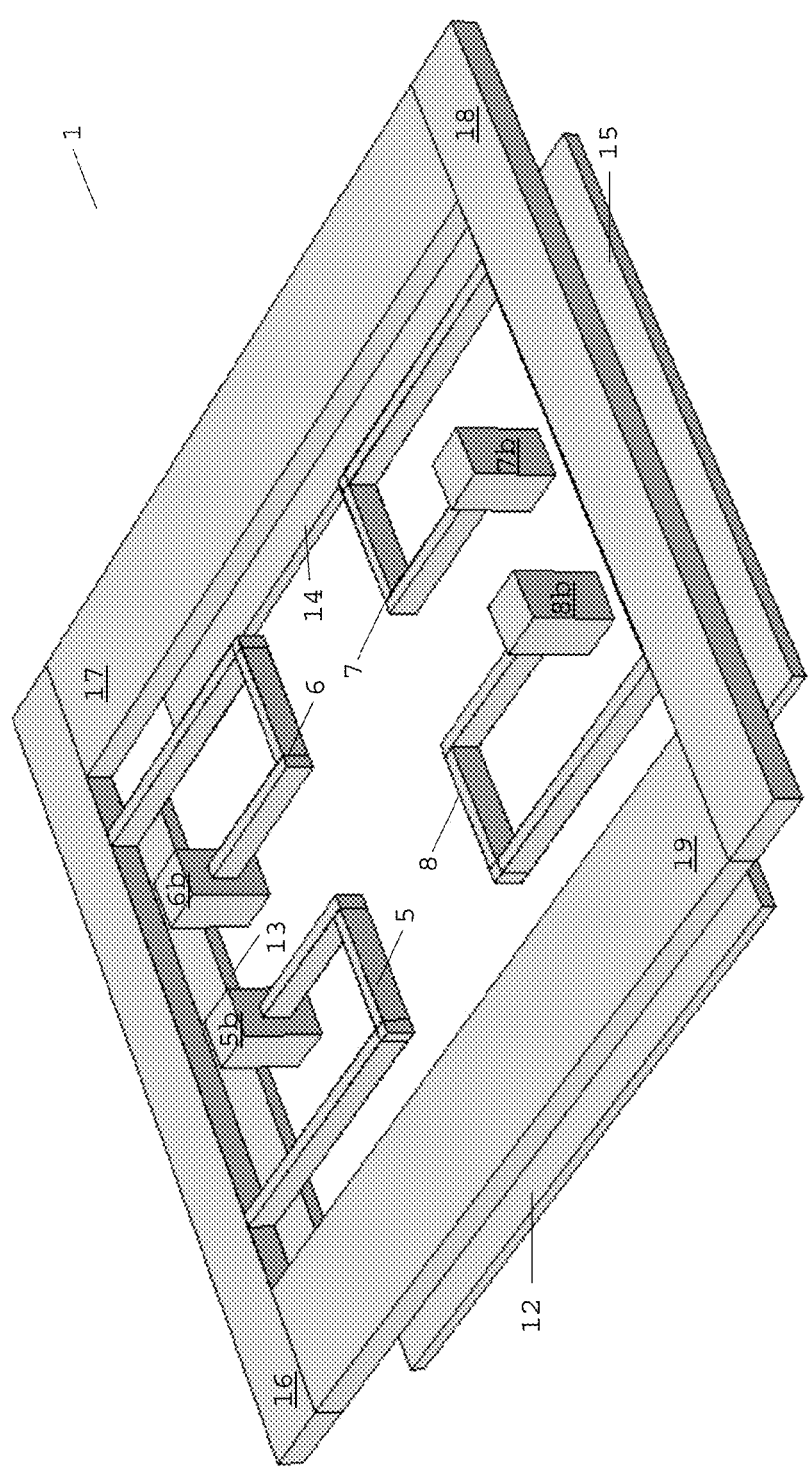
FIG. 3 shows a schematic view of a magnetometer having folded beam torsion springs according to this disclosure.
Figure 4:
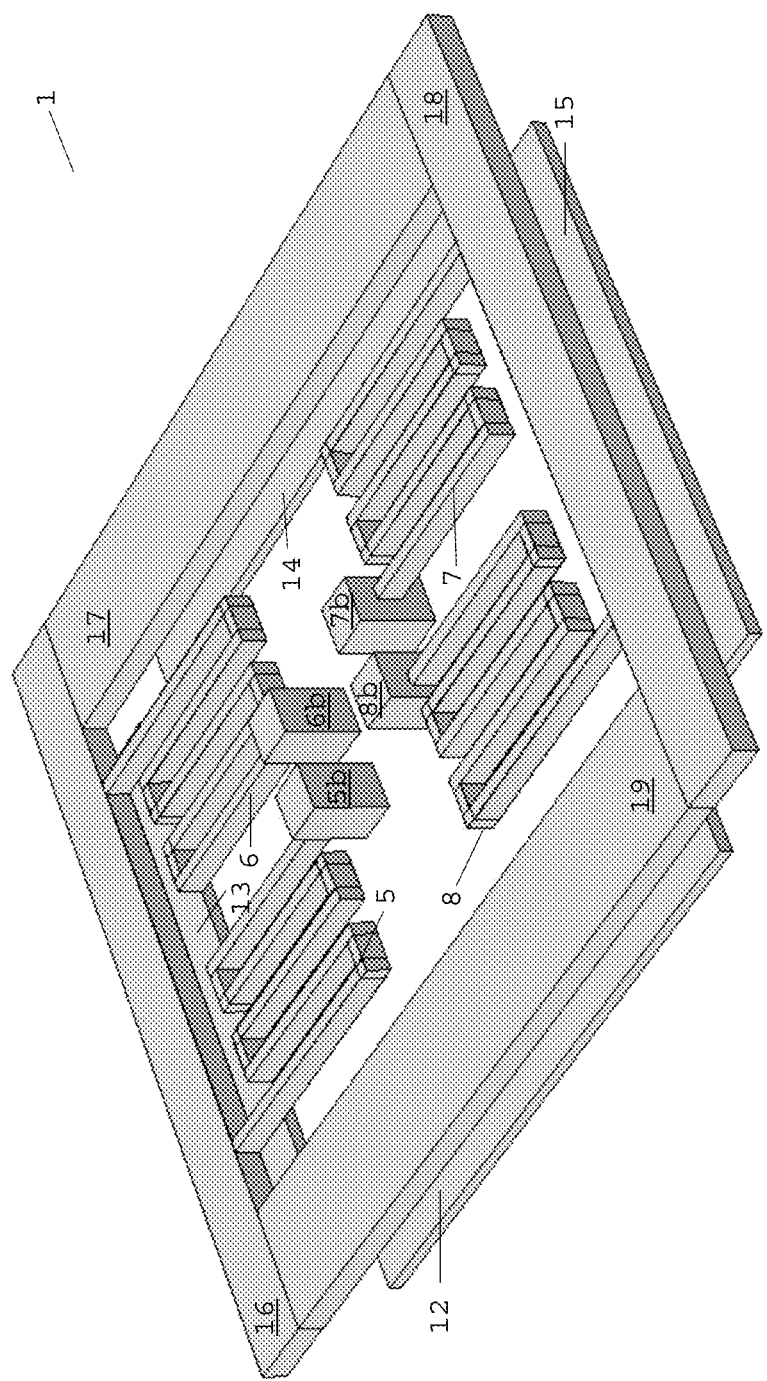
FIG. 4 shows a schematic view of a magnetometer having serpentine beam torsion springs according to this disclosure.

The torsion springs can include, for example, L-shaped spring, folded beam springs as shown in FIG. 3, or serpentine springs as shown in FIG. 4. The layout of the spring can be selected in view of the sensitivity and stiffness. Generally, a serpentine spring will be less stiff and more sensitive than an L-shaped spring. For the purpose of teaching the disclosure, and without intending any limitation, L-shaped springs were used.

Principle of Operation

As shown in FIG. 1, the proposed resonant magnetometer 1 includes a seesaw (or teeter-totter) plate or frame 2 that is held by four, here L-shaped, torsion springs 5, 6, 7, 8 anchored at one end 5b, 6b, 7b, 8b to a substrate 9 and at their other end 5a, 6a, 7a, 8a to an inner wall 3, 4 of the frame 2, such that opposing inner walls 3, 4 are only contacted by two of the springs. Bringing the springs inside the seesaw plate or frame 2, makes the magnetometer more compact, thereby occupying a relatively small area or footprint. The configuration of the springs enables the microstructure to rotate around an x-axis and a y-axis with angles $\eta_x$ and $\eta_y$, respectively. The magnetic field components $B_x$ and $B_y$ can be measured in this way.

Figure 2:
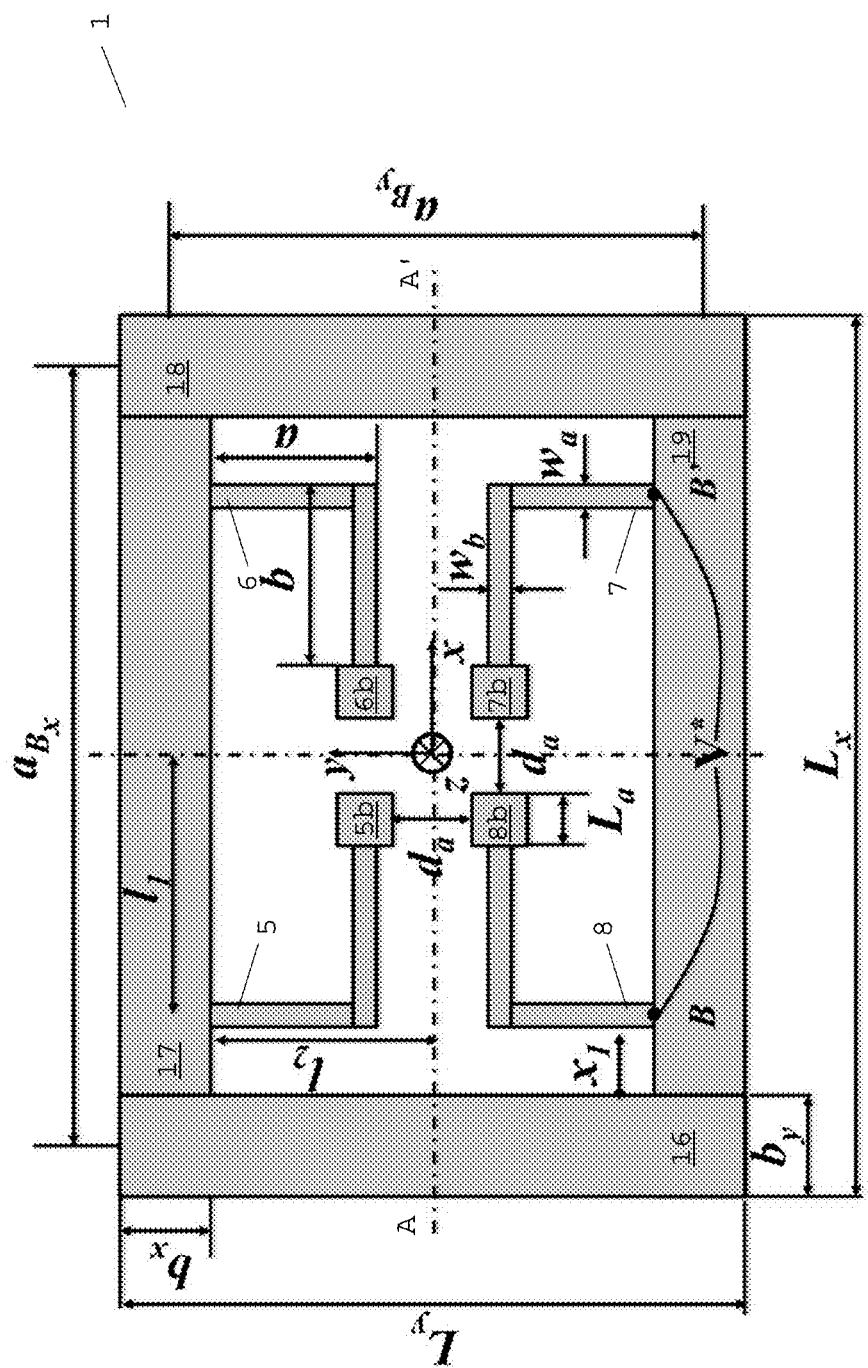
FIG. 2 shows a schematic top view of the magnetometer shown in FIG. 1 identifying the dimensions thereof.

The principle of operation is based on the Lorentz Force $\vec{F} = L\vec{I} \times \vec{B}$, acting on a current I carrying conductor with length L when placed in a magnetic field B. As shown in FIGS. 1 and 2, an AC voltage difference V, with a frequency preferably equal to the microstructure resonance frequency of the sensing mode in which the device operates, is applied between diagonally facing anchors, 5b and 7b or 6b and 8b, with a configuration that creates an opposite current $I_x$ and $I_y$ on opposite sides of the frame 2. This voltage difference is created by connecting directly facing anchors, 5b and 6b or 7b and 8b, to different power lines 10, 11 present on the substrate 9.

As a result, equal and opposite forces $F_{Bx} \approx B_x . I_y . 2.l_1$ and $F_{By} \approx B_y . I_x . 2.a_{By}$ acting on opposite sides of the frame 2 are created. The dimensions of the frame 2 are shown generally in FIG. 2. These forces generate torques $T_y \sim F_{Bx} . a_{By}$ and $T_x \sim F_{By} . a_{Bx}$, which make the frame 2 rotate around the x-axis and the y-axis, respectively. Hence the magnetometer senses the magnetic field in these two orthogonal axes.

This rotational movement is translated into a capacitance change because each side 16, 17, 18, 19 of the seesaw frame forms one of two electrodes of a parallel plate capacitor. The other electrode 12, 13, 14, 15 is fixed on the substrate 9 and is capacitively coupled to the corresponding side 16, 17, 18, 19 of the frame. FIG. 1 illustrates the location of the 4 capacitors, $C_{By1}$ (15,18), $C_{By2}$ (13,16), $C_{Bx1}$ (14,17) and $C_{Bx2}$ (12,19), formed between the electrodes on the substrate and the sides of the frame. Each pair of capacitors will measure the rotation of the seesaw frame around one axis: the pair $C_{By1}$ (15,18) and $C_{By2}$ (13,16) around the y-axis, and the pair $C_{Bx1}$ (14,17) and $C_{Bx2}$ (12,19) around the x-axis.

Capacitors at opposite positions, $C_{Bx1}$ $C_{Bx2}$ and $C_{By1}$ $C_{By2}$, of the frame 2 along this axis will yield an opposite capacitance signal. This capacitance change $\Delta C_{Bi}$, either $C_{Bx1}-C_{Bx2}$ or $C_{By1}-C_{By2}$, is differential due to the opposite movement of opposite sides 19,17 and 16,18 of the seesaw frame. Hence the differential capacitance is measured between opposite capacitors. This capacitance change is proportional to the value of the magnetic field components $B_x$ and $B_y$, respectively.

In order to have the largest differential capacitance change $\Delta C_{Bi}$, the external AC voltage difference V applied over a pair of anchors (5b, 6b or 7b, 8b), each connected to another power supply line 10,11, of the torsion springs should be set to a frequency equal to the microstructure resonant frequency of the respective $B_x$ and $B_y$ sensing modes. This enhances the mechanical response of the frame by the mechanical quality factor Q.

Design Approach

As an example, the design of such a magnetometer is to fit a chip area less than 250 µm (micrometer) by 300 µm. Some dimensions are chosen constant or have upper limits, as listed in the example of Table 1. Other dimensions (e.g., $l_1, l_2, \ldots$) can be chosen based on optimization criteria for achieving equal (and maximal) relative sensitivities $S_{xx}$ and $S_{yy}$ in x and y directions, respectively.

TABLE 1

Dimensions for the device shown in FIG. 2

| Dimension | Value | Constraint |
|---|---|---|
| $L_a$ | 15[µm] | — |
| $x_1$ | 10[µm] | — |
| $w_a = w_b$ | 4[µm] | Equal to thickness(t) |
| $d_a$ | 20[µm] | Minimizing feedthrough |
| $L_y$ | <250[µm] | chip area |
| $L_x$ | <300[µm] | chip area |

The relative sensitivity is the figure of merit that can be used to judge the performance of the magnetometer. The relative sensitivity in $j^{th}$ direction due to a magnetic field component in $i^{th}$ direction (i,j refers to either x or y direction) is defined as follows:

$$S_{ij} = \frac{1}{C_{0_{B_j}}} \frac{\partial \Delta C_{B_j}}{\partial B_i} \quad (1)$$

$$= \frac{1}{C_{0_{B_j}}} \frac{\partial \Delta C_{B_j}}{\partial w} \cdot \frac{\partial w}{\partial \eta_j} \cdot \frac{\partial \eta_j}{\partial T_j} \cdot \frac{\partial T_j}{\partial B_i}$$

When (i=j=x or y) in the above Equation (1), it represents the relative sensitivities $S_{xx}$ and $S_{yy}$ due to magnetic field components $B_x$ and $B_y$, respectively. When (i≠j) in the above Equation (1), it represents cross sensitivities $S_{xy}$ and $S_{yx}$ between the two axes. The four terms in Equation (1) are further discussed below.

The first term in Equation (1) is the change in differential capacitance due to electrode displacement w in the z direction. For a capacitance with an electrode area $A_{ei}$, it can be expressed as:

$$\frac{1}{C_{0_{B_j}}} \frac{\partial \Delta C_{B_j}}{\partial w} = \frac{1}{C_{0_{B_j}}} \frac{2\varepsilon_0}{d_0^2} \int\int_{A_{c_i}} \frac{1+(w/d_0)^2}{(1-(w/d_0)^2)^2} dx dy \quad (2)$$

where $C_{0Bj} = \varepsilon_0 A_{ei}/d_o$ and $d_o$ is the gap in steady state, e.g., the distance between a side of the frame and the corresponding electrode on the substrate 9 when the frame 2 is parallel to the substrate 9. Assuming small deflections compared to the gap $d_o$, Equation (2) converges to $2/d_o$.

The second term in Equation (1) reflects the change in electrodes' vertical displacement due to the rotation angle caused by the torque exerted on the frame 2. For small rotation angles, this term can be expressed as follows:

$$\partial w/\partial \eta_y = (l_1 + w_a/2 + x_1 + b_y/2) = 0.5 a_{B_x} \quad (3a)$$

$$\partial w/\partial \eta_x = (l_2 + b_x/2) = 0.5 a_{B_y} \quad (3b)$$

where $a_{Bi}$ is the average torque arm when the component $B_i$ is responsible for the rotation of the frame.

The third term in Equation (1) represents the transfer function between the rotation angle $\eta_j$ and the exerted torque $T_j$. Considering the system as a single degree of freedom (SDOF) system, the transfer function is as follows:

$$\partial \eta_j / \partial T_j = \frac{K_{\eta_j \eta_j}^{-1}}{\sqrt{(1-(\omega/\omega_{0j})^2)^2 + (Q^{-1}\omega/\omega_{0j})}} \quad (4)$$

where Q is the quality factor (e.g, Q=1000), $\omega_{0j}$ is the radial angular frequency of the resonant sensing mode when rotating around the $j_{th}$ axis and $K_{\eta_j \eta_j}$ is the rotational stiffness for the whole structure when it rotates around the $j_{th}$ direction. Rotational stiffness $K_{\eta_j \eta_j}$ is a function of the stiffness matrix elements of the torsion spring.

Using Castigliano's principle, the stiffness matrix that relates the out-of-plane displacements $\delta_z$, $\phi$, and $\eta$ with force $F_z$ and moments $M_\phi$ and T acting on the free guided segment of a spring as shown in the insert of FIG. 1 can be deduced. These parameters are related through a stiffness matrix as follows:

$$\begin{bmatrix} F_z \\ M_\phi \\ T \end{bmatrix} = \begin{bmatrix} k_{zz} & k_{z\phi} & k_{z\eta} \\ & k_{\phi\phi} & k_{\phi\eta} \\ sym. & & k_{\eta\eta} \end{bmatrix} \begin{bmatrix} \delta_z \\ \phi \\ \eta \end{bmatrix} \quad (5)$$

Each element of the stiffness matrix is a function of the material properties (e.g., Young's modulus E, shear modulus G) and the geometry of the torsion spring ($\beta = b/a, a, w_a, w_b$). Expressions of array elements stiffness matrix can be used to obtain the rotational stiffness for the whole structure around the x-axis and the y-axis. This can be done by considering one quarter of the whole structure, constructing the free-body-diagram, writing the moment equilibrium equations and geometrical constraints and substituting from Equation (5) in the moment equilibrium equations.

Stiffnesses of the whole structure can be expressed as follows:

$$K_{\eta_y \eta_y} = T_y/\eta_y = 4(k_{\eta\eta} + 2k_{z\eta}l_1 + k_{zz}l_1^2) \quad (6a)$$

$$K_{\eta_x \eta_x} = T_x/\eta_x = 4(k_{\phi\phi} + 2k_{z\phi}l_2 + k_{zz}l_2^2) \quad (6b)$$

The fourth term in Equation (1) represents the torque-magnetic field relation. It is the multiplication of the current through the length of this current carrying conductor and the torque arm. It can be expressed as follows:

$$\partial T_y/\partial B_x = I_y \cdot a_{B_x} \cdot 2(l_2 + b_x/2) \quad (7a)$$

$$\partial T_x/\partial B_y = I_x \cdot a_{B_y} \cdot 2(l_1 + w_a/2) \quad (7b)$$

where $$I_y = \frac{V^*}{0.5 R_{s_y}} = \frac{2V^*}{\frac{2(l_2 + b_x/2)}{\sigma b_y}t},$$

$$I_x = \frac{V^*}{0.5 R_{s_x}} = \frac{2V^*}{\frac{2(l_1 + w_a/2)}{\sigma b_x}t}$$

where $V^*$ is the voltage between points B and B' as shown in FIG. 2. The factor 0.5 is due to the fact that the voltage V is applied over two similar parallel branches. This makes the resistance seen by a current $I_x$ or $I_y$ half the resistance of one electrode. Expressing the torque-magnetic field in terms of voltage $V^*$ make it possible to express sensitivities either in $l_1$ or $l_2$ but not together. This simplifies the formula to be optimized.

At the resonance frequency of a sensing mode, the sensitivities $S_{xx}$ and $S_{yy}$ are proportional to:

$$S_{xx} \propto QK_{n_yn_y}^{-1} \cdot (l_1 + x_1 + w_a/2 + b_y/2)^2 \cdot b_y \quad (8a)$$

$$S_{yy} \propto QK_{n_yn_y}^{-1} \cdot (l_2 + b_x/2)^2 \cdot b_x \quad (8b)$$

The chip area and the spacing between the anchors impose geometrical constraints on the dimensions $l_1$, $l_2$, $b_x$, and $b_y$ of the frame 2 shown in FIG. 2. These constraints are indicated by $G_{l_1U}$, $G_{l_1U}$ and $G_{b_y}$ and are further explained in Table 2. Table 3 lists material properties for the frame and the springs when made of silicon-germanium. Each of the dimensions $l_1$ and $l_2$ has an upper and a lower limit so as not invoke those constraints.

TABLE 2

Geometrical constraints on dimensions of the frame $l_1$, $L_2$, $b_x$ and $b_y$.

| Dimension | Constraint | Constraint formula |
|---|---|---|
| $l_1$ | $G_{l_1L}$ | $>= b + [d_a/2 + L_a - w_a/2]$ |
|  |  | $>= \beta a + 23[\mu m]$ |
|  | $G_{l_1U}$ | $<= (L_x/2 - w_a/2 - x_1 - b_y)$ |
|  |  | $<= (138[\mu m] - b_y$ |
| $l_2$ | $G_{l_2L}$ | $>= a + [d_a/2 + L_a/2 - w_b/2]$ |
|  |  | $>= a + 15.5[\mu m]$ |
|  | $G_{l_2U}$ | $<= (L_y/2 - b_x)$ |
|  |  | $<= (125[\mu m] - b_x)$ |
| $b_y$ | $G_{b_yU}$ | $<= 115[\mu m] - \beta a$ |
| $b_x$ | $G_{b_xU}$ | $<= 109.5[\mu m] - a$ |

TABLE 3

Material properties of silicon germanium and gap height used during simulation

| E[GPa] | ν | ρ[kg/m³] | $\rho_e$[Ωm] | $d_0$[μm] |
|---|---|---|---|---|
| 120 | 0.22 | 4557 | $7 \times 10^{-6}$ | 3 |

To find the equal (and maximal) relative sensitivities, the insight provided by Equations (8a, 8b) can be used. These equations teach that $b_x$ and $b_y$ should be maximized and the dimensions $l_1$ and $l_2$ should be minimized. The locus of the maximum values for $b_y$ and $b_x$ is obtained when meeting the constraints ($G_{l_1L}$ and $G_{l_1U}$) and ($G_{l_2L}$ and $G_{l_2U}$), respectively.

The maximum of $S_{xx}$ and $S_{yy}$ is at the intersection of constraints ($G_{b_yU}$, $G_{l_1U}$ and $G_{l_1U}$) and ($G_{b_xU}$, $G_{l_2U}$ and $G_{l_2U}$), respectively. However, the relative sensitivities $S_{xx}$ and $S_{yy}$ at the intersection may not be equal to each other. The smaller of the two will be the best achievable sensitivity at the specific value of β and a.

Figure 5:
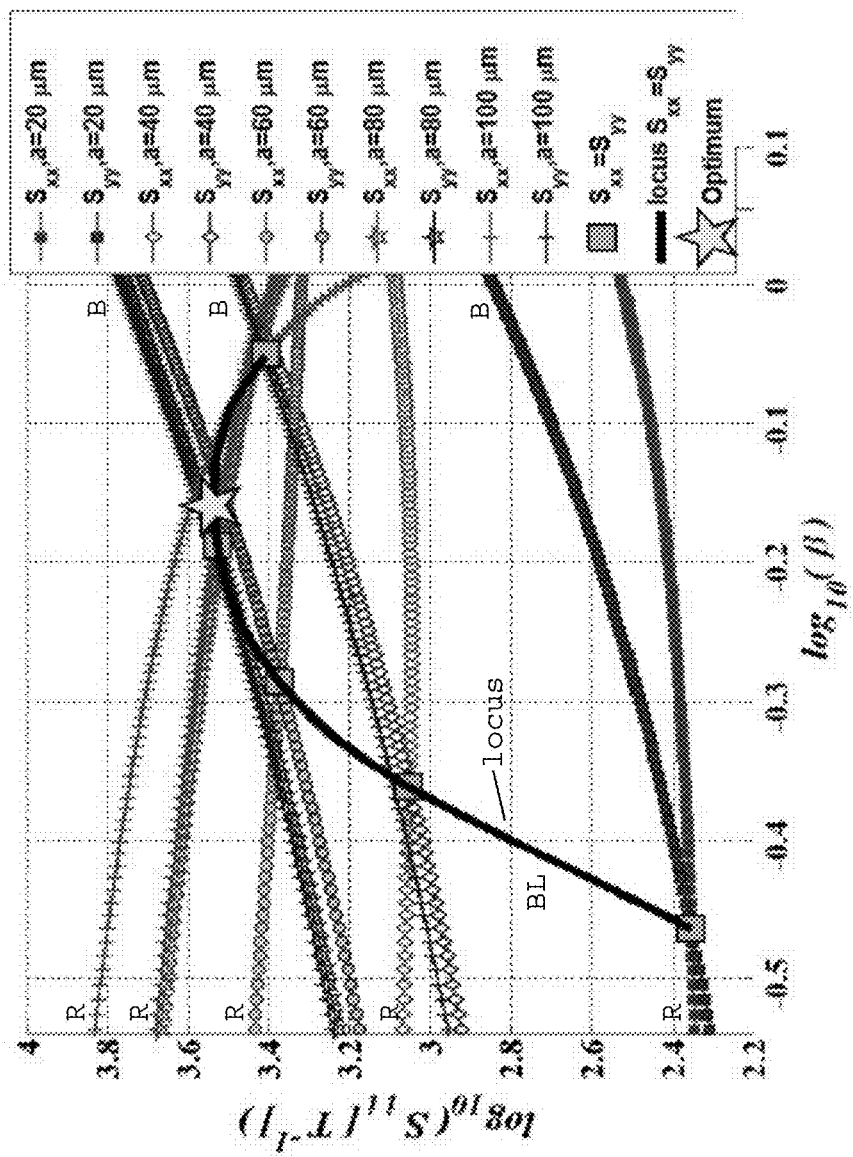
FIG. 5 plots the sensitivities $S_{xx}$ and $S_{yy}$ for different values of a and β according to an example of this disclosure.

As shown in FIG. 5, a sweep on different values for β and a was made to obtain values for which maximal and equal sensitivities are obtained. Each point on a curve R and a curve B represents the maximum of $S_{xx}$ and $S_{yy}$, as discussed herein. Their intersection (squares) is the point of equal sensitivity. The locus of equal sensitivities is represented by the curve BL. The maximal (and equal) sensitivity will be the maximum of the curve BL (star). The optimum dimensions in this design example are a=85 μm, β=0.69, $l_1$=81.96 μm, $l_2$=100.5 μm, $b_y$=56.04 μm, and $b_x$=24.5 μm. This corresponds to an (average) relative sensitivity $S_{xx} \sim S_{yy} \sim 3471[T^{-1}]$.

FEM Simulations

FEM simulations using COMSOL were performed to study the performance of the magnetometer. This was done by applying distributed opposite forces in the z direction, simulating Lorentz forces $F_{Bx}$ and $F_{By}$, on the opposite sides of the frame 2. To calculate the sensitivities, Equation (1) was used. All terms can be easily evaluated through integration and averaging on moving domains.

The third term of Equation (1) involves calculating torsional stiffness, and can be calculated through transformation of the stiffness in the z direction ($F_z/\delta_z$) into a torsional stiffness $(F_z/\delta_z)a_{Bi}^2/2$ with $a_{Bi}$ being the average length of the torque arm.

Figure 6A:
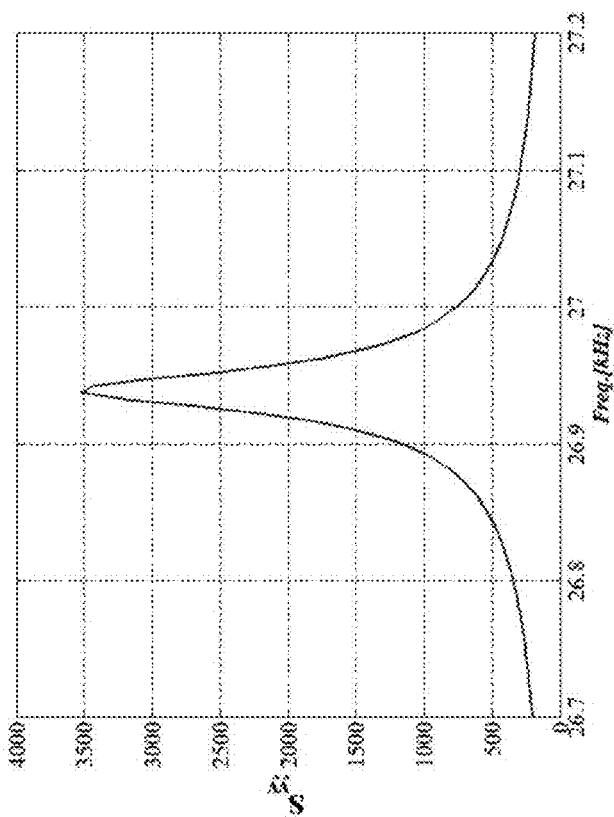
FIGS. 6a-6b show COMSOL simulations of relative sensitivities $S_{xx}$ (FIG. 4a) and $S_{yy}$ (FIG. 4b) versus frequency with the sensing mode shape for the design example of this disclosure.
Figure 6B:
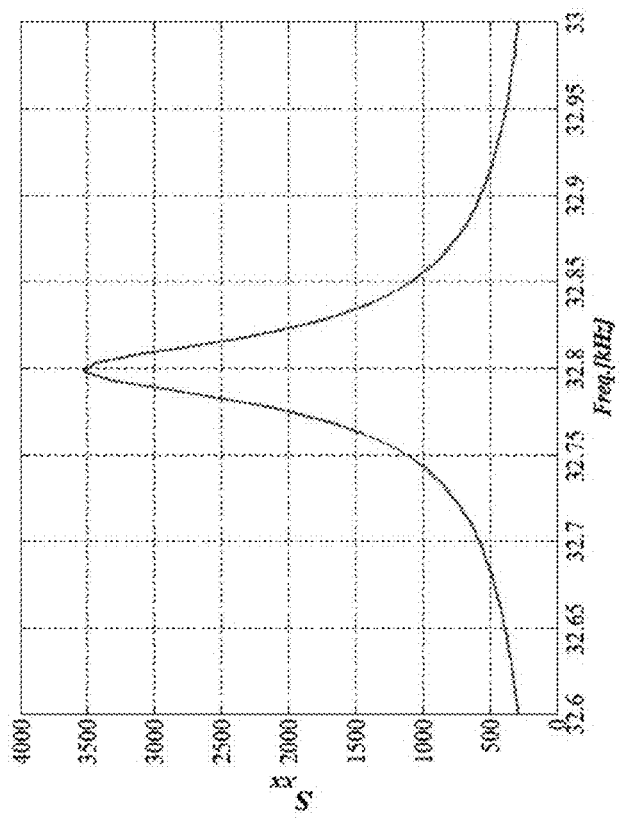

A stationary FEM simulation using Solid mechanics, with the optimum dimensions derived above, showed that the sensitivities $S_{xx}$ and $S_{yy}$ are not equal: $S_{xx} \approx 4042 [T^{-1}]$ and $S_{yy} \approx 3547 [T^{-1}]$. To remedy this, one of the dimensions could be sized down. Reducing $b_y$ from 56.04 μm to about 51.3 μm, yields nearly equal sensitivities $S_{xx} \approx 3550 [T^{-1}]$ and $S_{yy} \approx 3547 [T^{-1}]$, as shown in FIGS. 6a and 6b, respectively.

The cross sensitivities are as minimal as possible by employing differential capacitive sensing and operating the device in orthogonal sensing mode shapes.

The difference in values between the sensitivity values between analytical models and FEM is due to the fact that Equation (6) was found to overestimate the stiffness, compared to FEM. However, the reduced $b_y$ was 9% off of the value predicted by the analytical model.

Equivalent Circuit

Equivalent circuit has been an effective tool to map all different energy domains in a multi-physics system like MEMS to the electrical domain. Equivalent circuits are developed starting from the first law of thermodynamics (conservation of energy) assuming lossless systems and equations of equilibrium for the different energy domains. However, this equivalency is conditioned by the linearity around the biasing point. As a simplification, only the electrical and mechanical energy domains are considered when developing the equivalent circuit of the magnetometer described above. Each energy domain is represented by a port that is fully described by two state variables (flow and effort).

Figure 7:
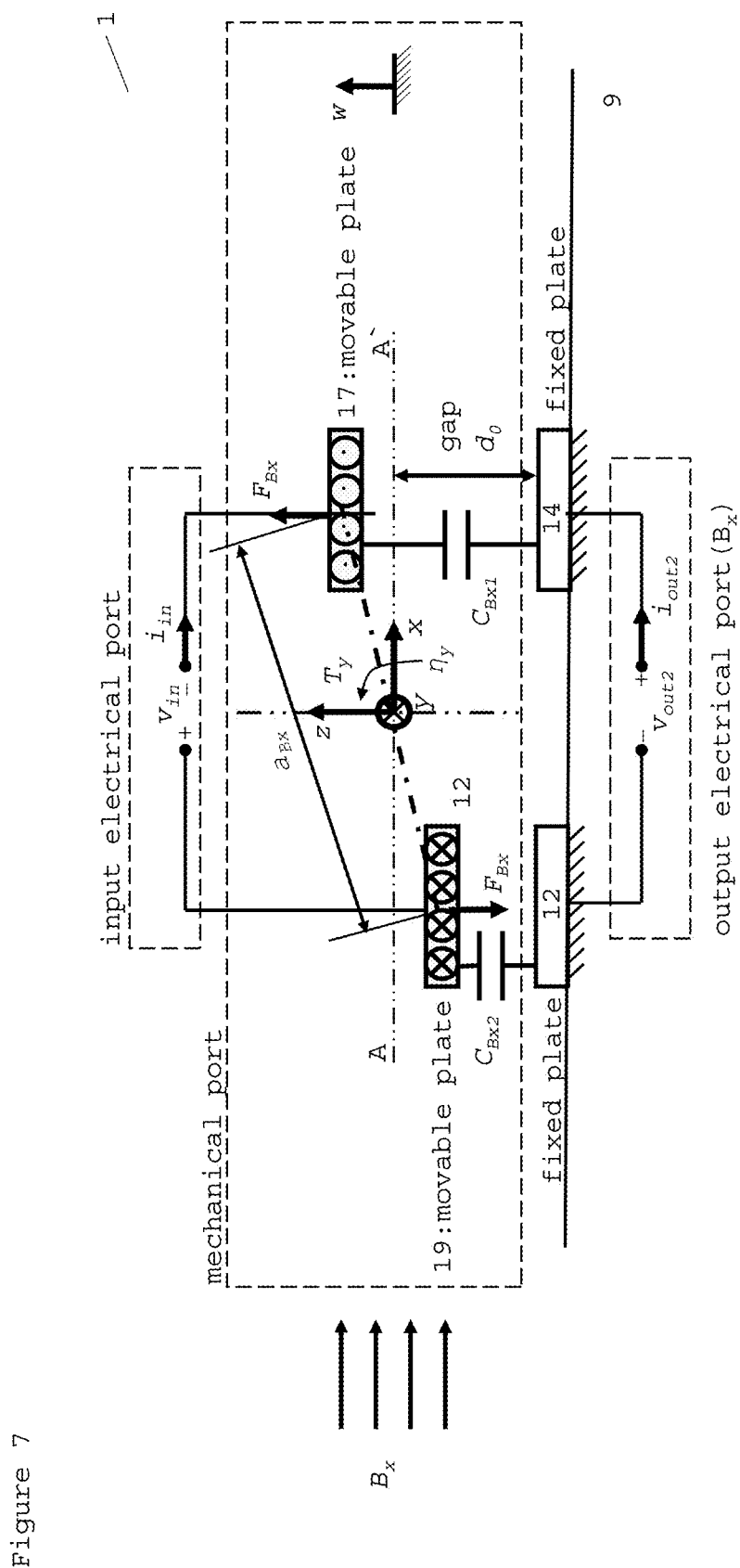
FIG. 7 shows a schematic cross section of the magnetometer shown in FIG. 1.

FIG. 7 shows that the magnetometer system has two electrical ports and one mechanical port. Energy exchange between input electrical port and mechanical ports can be represented by an electrodynamic subtransducer. As a result of this energy exchange, states of the output electrical port change. This energy exchange can be presented by electrostatic sub-transducer.

The system can be broken down into an electrodynamic sub-transducer and an electrostatic subtransducer.

Figure 8:
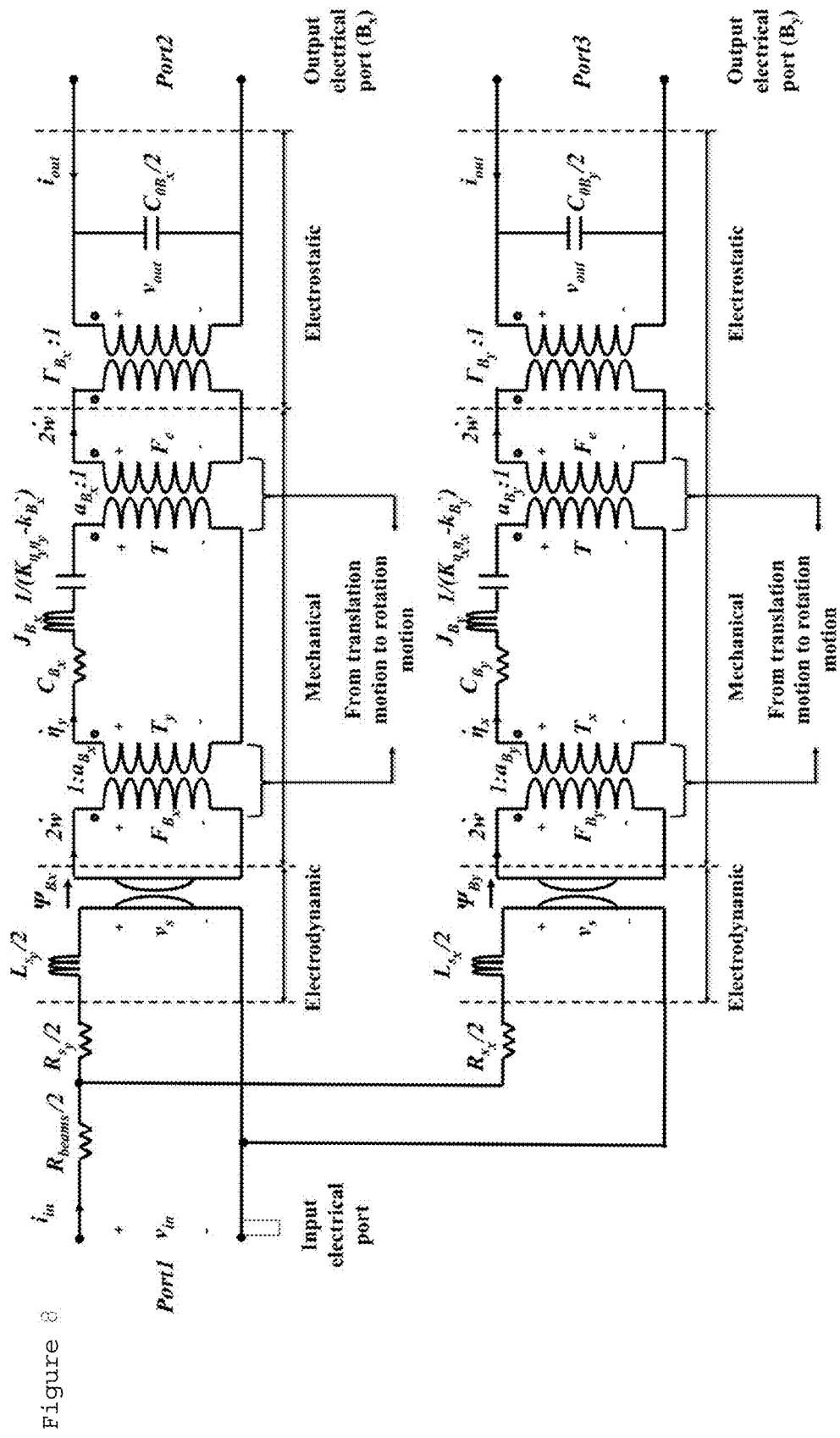
FIG. 8 shows an electrical equivalent circuit of the magnetometer shown in FIG. 1 for the two in-plane components of the magnetic field.
Figure 9B:
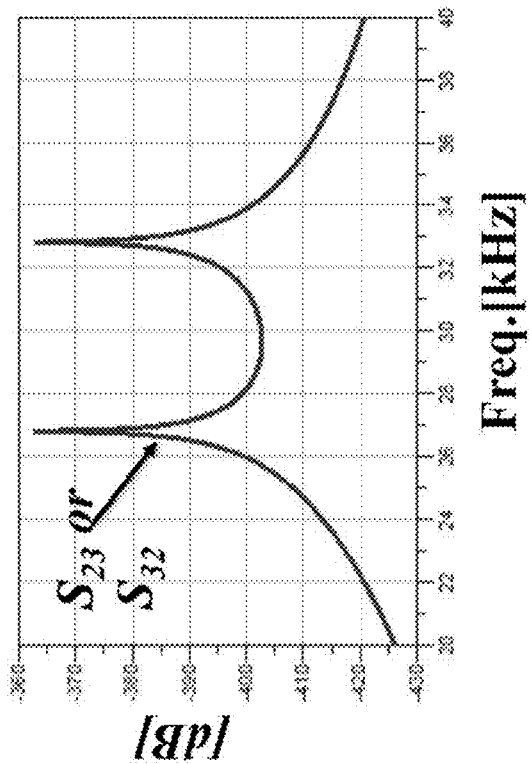
FIGS. 9a-9b show the amplitude plot of the S-parameters of the equivalent circuit of the magnetometer shown in FIG. 1.
Figure 9A:
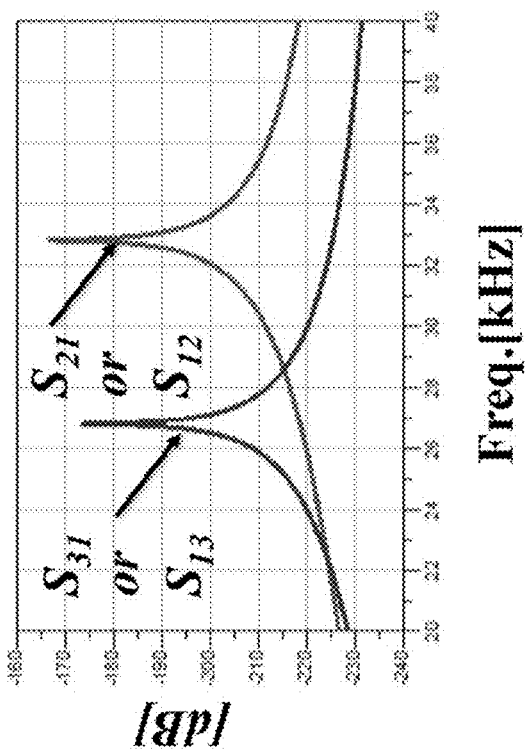
Figure 10B:
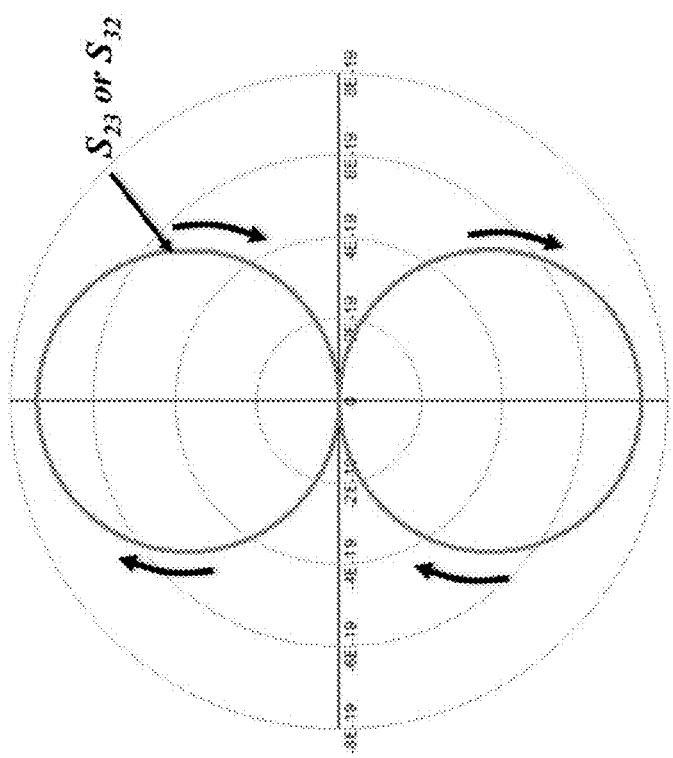
FIGS. 10a-10b show the polar plot of the S-parameters of the equivalent circuit of the magnetometer shown in FIG. 1.
Figure 10A:
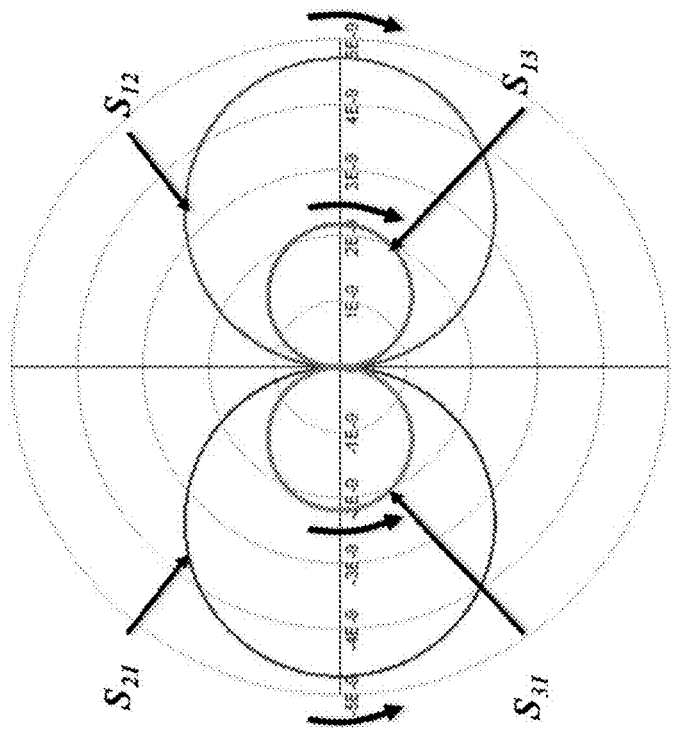

The electrodynamic transducer accounts for the energy exchange between input electrical port ($v_{in}$, $q_{in}$) and the mechanical port (w, $F_{Bi}$). The ABCD matrix of an electrodynamic transducer held by no spring and involving translation motion in the z direction, is as follows:

$$\begin{bmatrix} v_{in} \\ i_{in} \end{bmatrix} = \begin{bmatrix} j\omega L_{s_i} & \Psi_{B_i} \\ \Psi_{B_i} & 0 \end{bmatrix} \begin{bmatrix} F_{B_i} \\ -w \end{bmatrix} \quad (9)$$

$$= \begin{bmatrix} 1 & j\omega L_{s_i} \\ 0 & 1 \end{bmatrix} \begin{bmatrix} 0 & \Psi_{B_i} \\ 1/\Psi_{B_i} & 0 \end{bmatrix} \begin{bmatrix} F_{B_i} \\ -w \end{bmatrix}$$

where $L_{si}$ and $\Psi_{bi}$ are the self-inductance of the conductor lying in the $i^{th}$ direction and the magnetic transduction factor for the $B_i$ component respectively. This subtransducer represents the input port as shown in FIG. 8.

The electrostatic transducer accounts for the energy exchange between the mechanical port (w, $F_e$) and the output electrical port ($v_{out}$, $q_{out}$). The ABCD matrix of an electrostatic transducer held by an spring $K_{spr}=K_{\eta i\eta i}/a_{Bi}^2$ and involving translation motion in z direction, is as follows:

$$\begin{bmatrix} v_{out} \\ i_{out} \end{bmatrix} = \begin{bmatrix} \dfrac{1}{\Gamma_{B_i}} & \dfrac{1}{j\omega \Gamma_{B_i}}(K_{spr} - k'_{B_i}) \\ \dfrac{j\omega C_{0B_i}}{2\Gamma} & \dfrac{K_{spr} C_{0B_i}}{2\Gamma} \end{bmatrix} \begin{bmatrix} F_e \\ -w \end{bmatrix} \quad (10)$$

$$= \begin{bmatrix} 1 & 0 \\ \dfrac{j\omega}{2} C_{0B_i} & 1 \end{bmatrix} \begin{bmatrix} \dfrac{1}{\Gamma_{B_i}} & 0 \\ 0 & \Gamma_{B_i} \end{bmatrix} \begin{bmatrix} 1 & \dfrac{1}{j\omega}(K_{spr} - k'_{B_i}) \\ 0 & 1 \end{bmatrix} \begin{bmatrix} F_e \\ -w \end{bmatrix}$$

where $\Gamma_{Bi}$ and $K'_{Bi}=\Gamma^2/C_{OBi}$ are the electrical transduction factor for $B_i$ and the spring constant due to softening effect, respectively. The capacitance at the output port was reduced by a factor of 2 because the differential capacitances appear as if they are connected in series. This sub-transducer represents the output port as shown in FIG. 6.

The proposed magnetometer is based on torsion. It is considered a rotary system. The developed equivalent circuit is for translation systems. So, a transformation is needed that links the translation movement of electrodes in the z direction to the rotation $\eta_i$. This linking can be done through the following equations:

$$T_j = a_{B_i} F_{B_i} \quad (11a)$$

$$\eta_j = 1/a_{B_i}(2w) \quad (11b)$$

These equations can be presented by a transformer with turns ratio (1:$a_{Bi}$). As shown in FIG. 8, this transformation is used twice to transform the translation motion ($F_{Bi}$,w) into a rotary motion ($T_j$,$\eta_j$).

Simulation of the Equivalent Circuit

Table 4 lists values and expressions for circuit elements for sensing circuits of magnetic field components $B_x$ and $B_y$.

FIGS. 9a-9b and 10a-10b shows Advanced Design Simulation of the equivalent circuit of the magnetometer using a bias voltage $V_b$=1V and magnetic fields $B_x$=$B_y$=60 µTesla. Simulations show that scattering parameters $S_{12}$ (representing gain for sensing $B_x$) and $S_{13}$ (representing gain for sensing $B_y$) have different resonance frequency, which works in favor of isolating $B_x$ and $B_y$ sensing circuits. Besides, $S_{23}$ and $S_{32}$ (represent cross-sensitivities between sensing ports for $B_x$ and $B_y$) have very low amplitude levels compared to $S_{21}$ and $S_{31}$, indicative of the improved self-sensitivity of the disclosed device for $B_x$ and $B_y$ due to being less dependent on the other normal in-plane component.

TABLE 4

Values and expressions of circuit elements for sensing $B_x$ and $B_y$.

| Variable | Expression | Value |
|---|---|---|
| $J_{B_x}$ | $\rho t/12[L_x L_y^3 - (L_x - 2b_y)(L_y - 2b_x)^3]$ | 7.28[akg·m²] |
| $R_{s_y}$ | $2(l_2 + b_x/2)/(\sigma b_2 t)$ | 7.69[Ω] |
| $\Psi_{B_{x1}}$ | $B_x \cdot 2(l_2 + b_x/2)$ | 13.5[nA/N] |
| $K_{B_x}$ | $\Gamma_{B_x}^2 \alpha_{B_y}^2/C_{O_{Bx}}$ | 0.24[nN·m] |
| $\Gamma_{B_x}$ | $\epsilon_0 A_{ey} V_b/d_0^2$ | 12.6[nN/V] |
| $C_{B_x}$ | $\omega_{0y} J_{Bx}/Q$ | 1.5[fN/rad] |
| $L_{s_x}$ | COMSOL | ≈0[H] |
| $\omega_{0y}$ | COMSOL | 2.06 × 10⁵[rad/s] |
| $C_{OB_x}$ | $\epsilon_0 A_{ey}/d_0$ | 37.8[fF] |
| $K_{\eta_y \eta_y}$ | $\omega_{0y}^2 J_{Bx}$ | 3.1E-7[N·m] |
| $\alpha_{B_x}$ | Eq. (3a) | 239.2[µm] |
| $R_{beams}$ | $\rho c/t(a/w_a + b/w_b)$ | 62.98[Ω] |
| $J_{B_y}$ | $\rho t/12[L_y L_x^3 - (L_y - 2b_x)(L_x - 2b_y)^3]$ | 4.58[akg·m²] |
| $R_{s_x}$ | $2(l_1 + w_a/2)/(\sigma b_1 t)$ | 11.99[Ω] |
| $\Psi_{B_{y1}}$ | $B_y \cdot 2(l_1 + w_a/2)$ | 10[nA/N] |
| $K_{B_y}$ | $\Gamma_{B_y}^2 \alpha_{B_y}^2/C_{O_{By}}$ | 10.7[nN·m] |
| $\Gamma_{B_y}$ | $\epsilon_0 A_{ex} V_b/d_0^2$ | 7[nN/V] |
| $C_{B_y}$ | $\omega_{0x} J_{By}/Q$ | 0.76[fN/rad] |
| $L_{s_y}$ | COMSOL | ≈0[H] |
| $\omega_{0x}$ | COMSOL | 1.69 × 10⁵[rad/s] |
| $C_{OB_y}$ | $\epsilon_0 A_{ex}/d_0$ | 21[fF] |
| $K_{\eta_x \eta_x}$ | $\omega_{0x}^2 J_{By}$ | 1.3E-7[N·m] |
| $\alpha_{B_y}$ | Eq. (3b) | 225.5[µm] |

The invention claimed is:

1. A two axes MEMS resonant magnetometer comprising:
   in one plane, a freestanding rectangular frame having inner walls and four torsion springs disposed inside the frame, wherein opposing inner walls of the frame are contacted by one end of only two springs, each spring being anchored by its other end to a substrate
   wherein the substrate comprises two electrically isolated power supply lines, whereby diagonally facing anchored ends of the torsion springs are electrically connected to the same power supply line, and wherein the substrate is configured for the application of an AC voltage between the two power supply lines, the AC voltage having a frequency equal to the frequency of at least one of two orthogonal modes of the MEMS magnetometer, thereby creating a current flowing between opposite biased anchored ends of the torsion springs,
   wherein the substrate comprises four electrodes, each electrode being capacitively coupled to a different side of the frame thereby forming four capacitors, whereby the four electrodes are configured for differential capacitive measurement between opposite capacitors corresponding to a respective orthogonal mode, and wherein the differential capacitive measurement is adapted to be used to determine an in-plane component of a magnetic field in which the MEMS magnetometer is placed.

2. The MEMS magnetometer according to claim 1, wherein the rectangular frame and the torsion springs are formed in a single layer of the same material.

3. The MEMS magnetometer according to claim 2, wherein the material is a metal.

4. The MEMS magnetometer according to claim 1, wherein the torsion springs are L-shaped springs, and the other end of each spring is anchored towards the center of the frame, to a substrate.

5. A method for designing a MEMS magnetometer according to claim 1, comprising:
dimensioning the frame and the torsion springs to maximize the sensitivity of the differential capacitive measurement between opposite capacitors, while minimizing the sensitivity of the differential capacitive measurement between adjacent capacitors.

6. A method for operating a MEMS magnetometer, comprising:
placing the MEMS magnetometer in a magnetic field, wherein the MEMS magnetometer is a two axes MEMS resonant magnetometer comprising:
in one plane, a freestanding rectangular frame having inner walls and four torsion springs, wherein opposing inner walls of the frame are contacted by one end of only two springs, each spring being anchored by its other end to a substrate,
wherein the substrate comprises two electrically isolated power supply lines, and whereby diagonally facing anchored ends of the torsion springs are electrically connected to the same power supply line, and
wherein the substrate comprises four electrodes, each electrode being capacitively coupled to a different side of the frame thereby forming four capacitors, whereby the four electrodes are configured for differential capacitive measurement between opposite capacitors;
applying an AC voltage between the two power supply lines, the AC voltage having a frequency equal to the frequency of at least one of two orthogonal modes of the MEMS magnetometer, thereby creating a current flowing between opposite biased anchored ends of the torsion springs;
measuring the differential capacitance between opposite capacitors corresponding to a respective orthogonal mode; and
determining from this differential capacitance measurement an in-plane component of the magnetic field.

* * * * *